United States Patent
Fujii

(10) Patent No.: US 9,753,092 B2
(45) Date of Patent: Sep. 5, 2017

(54) BATTERY MONITORING SYSTEM FOR DETECTING A VOLTAGE DIFFERENCE OF UNIT CELLS CONNECTED IN SERIES IN A BATTERY PACK

(71) Applicant: DENSO CORPORATION, Kariya, Aichi-pref. (JP)

(72) Inventor: Hiroki Fujii, Kariya (JP)

(73) Assignee: DENSO CORPORATION, Kariya (JP)

( * ) Notice: Subject to any disclaimer, the term of this patent is extended or adjusted under 35 U.S.C. 154(b) by 175 days.

(21) Appl. No.: 14/837,636

(22) Filed: Aug. 27, 2015

(65) Prior Publication Data

US 2016/0091572 A1     Mar. 31, 2016

(30) Foreign Application Priority Data

Sep. 30, 2014 (JP) ................. 2014-200498

(51) Int. Cl.
*H01M 10/46* (2006.01)
*G01R 31/36* (2006.01)
*G01R 19/165* (2006.01)

(52) U.S. Cl.
CPC ... *G01R 31/3658* (2013.01); *G01R 19/16542* (2013.01); *G01R 31/362* (2013.01)

(58) Field of Classification Search
CPC ...... H02J 7/1423; H02J 7/0013; H02J 7/0018; H02J 7/0019; H02J 7/0021; H02J 7/345
USPC ......... 320/116, 117, 118, 119, 122, 132, 166
See application file for complete search history.

(56) References Cited

U.S. PATENT DOCUMENTS

| | | | |
|---|---|---|---|
| 8,207,703 B2 * | 6/2012 | Kurose | H02J 7/0016 320/116 |
| 2009/0167244 A1 * | 7/2009 | Kurose | H02J 7/0016 320/122 |

FOREIGN PATENT DOCUMENTS

JP        2009-276297 A     11/2009

OTHER PUBLICATIONS

Translation of JP 2009-276297, Nov. 26, 2009.*

* cited by examiner

*Primary Examiner* — Edward Tso
(74) *Attorney, Agent, or Firm* — Oliff PLC

(57) ABSTRACT

A battery monitoring system of flying capacitor type detects voltage difference between adjacent unit cells connected in series in battery pack. The system has the unit cells, an open and close section, a first and second capacitor, a first and second switching section, an ADC, and a microcomputer. The microcomputer instructs the open and close section to charge each of the first and second capacitors with each unit cell. After the first and second capacitors have been charged by the corresponding unit cells, the microcomputer instructs the first switching section to connect the first capacitor and the second capacitor in a reverse-polarity series connection. The microcomputer allows the second switching section to supply a voltage at both ends of the first and second capacitors connected in the reverse-polarity series connection, i.e. a voltage difference between the unit cells, to the ADC. The ADC supplies a conversion result to the microcomputer.

7 Claims, 3 Drawing Sheets

BATTERY MONITORING SYSTEM FOR DETECTING A VOLTAGE DIFFERENCE OF UNIT CELLS CONNECTED IN SERIES IN A BATTERY PACK

CROSS-REFERENCE TO RELATED APPLICATION

This application is related to and claims priority from Japanese Patent Application No. 2014-200498 filed on Sep. 30, 2014, the contents of which are hereby incorporated by reference.

BACKGROUND OF THE INVENTION

1. Field of the Invention

The present invention relates to battery monitoring systems capable of monitoring a state of each of the unit cells forming a battery pack.

2. Description of the Related Art

In general, a battery pack and an electric motor are mounted as a main vehicle engine on vehicles such as electric vehicles and hybrid vehicles. Such a battery pack is a high capacity pack capable of supplying a high voltage to the electric motor. The battery pack consists of a plurality of unit cells made of lithium ion rechargeable batteries, etc. The unit cells are connected in series.

In general, because each of the unit cells connected in series to form the battery pack has different characteristics, each unit cell has a different stage of charge (SOC) when the battery pack is charged and discharged. Accordingly, there is a possible problem of causing deterioration of a unit cell which enters an overcharge or over discharge state.

In order to avoid such a problem, a conventional technique detects a dispersion of SOC between unit cells in the battery pack in order to equalize the voltage of each of the unit cells. That is, the conventional technique detects an analogue voltage of each of the unit cells connected in series in the battery pack, and an analogue digital converter (ADC) performs an analogue to digital conversion (AD conversion) to convert the detected analogue voltage to a digital voltage. The conventional technique uses the obtained digital voltage as the voltage of each unit cell. The conventional technique calculates a difference in digital voltage between the unit cells, and uses the calculated voltage difference as a voltage dispersion in the unit cells. For example, a patent document 1, Japanese patent laid open publication No. 2009-276297 discloses such a conventional technique.

The ADC has an input voltage range which corresponds to a possible voltage range of each unit cell. When receiving a voltage (i.e. a voltage difference between unit cells), the ADC performs the AD conversion of the received analogue voltage to digital voltage values having a predetermined bit number).

A voltage conversion error occurs when the ADC performs the AD conversion. The more the AD conversion error of the AD conversion increases, the more the influence on a calculation accuracy of the voltage difference between the unit cells increases. For this reason, it is necessary to decrease the AD conversion error in order to increase the calculation accuracy of the voltage difference between the unit cells forming the battery pack.

SUMMARY

It is therefore desired to provide a battery monitoring system capable of detecting a dispersion of voltages of unit cells forming a battery pack with high accuracy.

An exemplary embodiment provides a battery monitoring system of a flying capacitor type. The battery monitoring system detects a voltage difference of unit cells connected in series in a battery pack. In the battery monitoring system, a detection result of a voltage difference between unit cells is sent to an analogue to digital converter. The battery monitoring system has a first and second capacitor, and a first and second switching section. The first capacitor and the second capacitor are connectable to each of the unit cells in the battery pack in order to charge the first and second capacitors using different unit cells. By the first switching section, the first capacitor and the second capacitor are connected in a reverse-polarity series connection after the first capacitor and second capacitor have been charged by the corresponding unit cells, respectively. By the second switching section a voltage both ends of both the first capacitor and the second capacitor connected in the reverse-polarity series connection, i.e. a voltage difference between the unit cells is supplied to the analogue to digital converter.

That is, after the first capacitor has been charged by one unit cell in the battery pack, and the second capacitor has been charged by another battery cell, the first capacitor and the second capacitor are connected in the reverse-polarity series connection. A voltage at both ends of the reverse-polarity series connection of the first capacitor and the second capacitor is supplied to the analogue to digital converter (ADC). In this case, the ADC receives a voltage difference in analogue form between the first capacitor and the second capacitor, i.e. the unit cells, and converts it to a digital voltage value. This structure makes it possible for the ADC to use a narrow input-voltage range and suppress and reduce a conversion error, and increases the calculation accuracy of the voltage difference between the unit cells as compared with those of the conventional technique.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
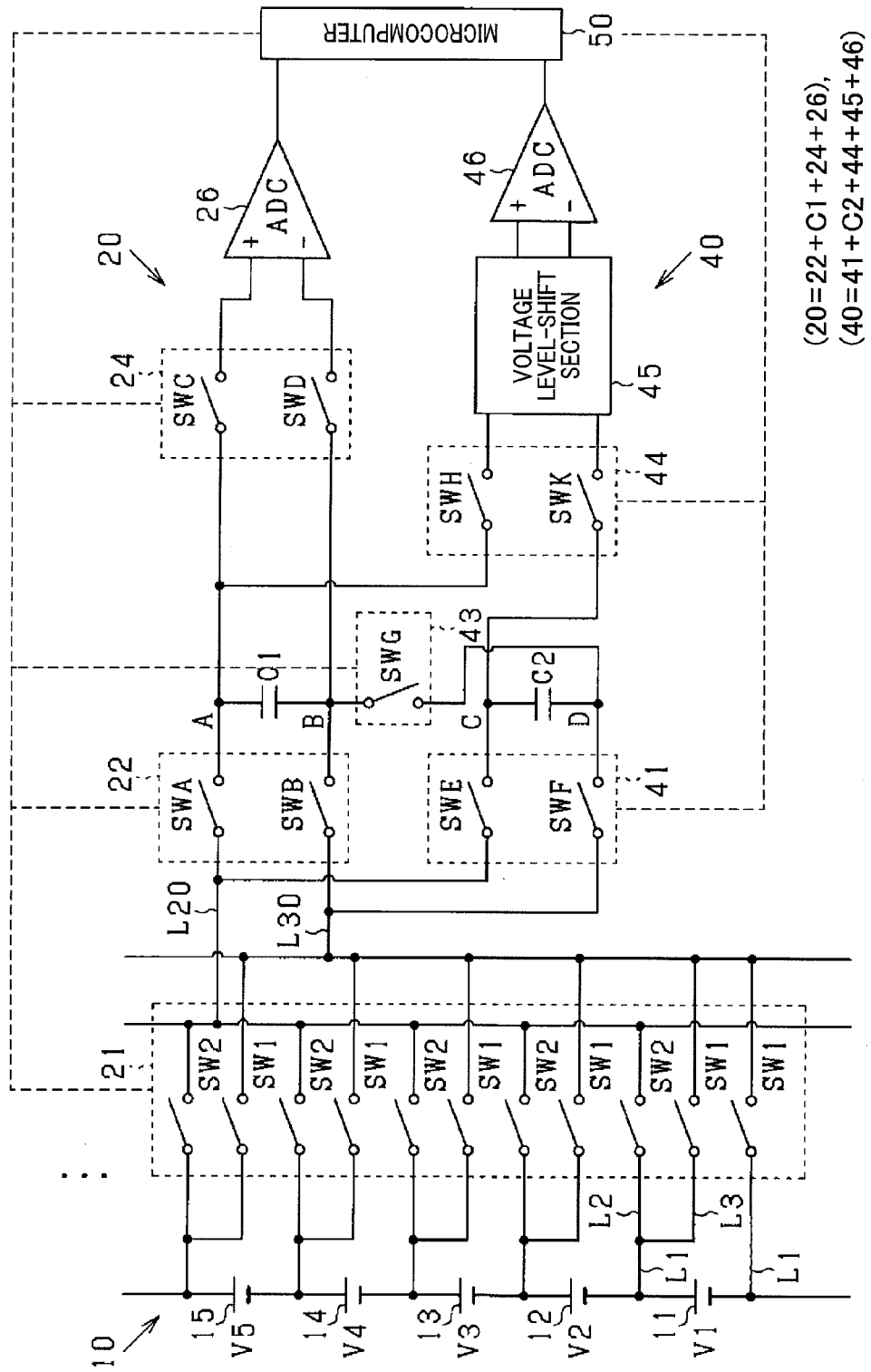
FIG. 1 is a view showing a schematic structure of a battery monitoring system according to an exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

Exemplary Embodiment

A description will be given of a battery monitoring system according to an exemplary embodiment with reference to FIG. 1, FIG. 2, and FIG. 3A and FIG. 3B.

FIG. 1 is a view showing a schematic structure of the battery monitoring system according to the exemplary embodiment.

A battery pack 10 is a high-capacity rechargeable battery to be mounted on a hybrid vehicle or an electric vehicle. As shown in FIG. 1, the battery monitoring system according to the exemplary embodiment is applied to the battery pack 10.

As shown in FIG. 1, the battery monitoring system according to the exemplary embodiment is equipped with the battery pack 10, a battery monitoring device 20, a voltage difference detection device 40 and a microcomputer 50.

The battery pack 10 supplies electric power to an electric motor (drive motor) as the main engine of the vehicle through an inverter, etc. In general, the battery pack 10 consists of a plurality of unit cells connected in series. FIG. 1 shows an example of the battery pack 10 equipped with the five unit cells 11 to 15 connected in series. That is, the unit cells 11 to 15 form a serial connection assembly in the battery pack 10. Each of the unit cells 11 to 15 is changed within a voltage range of 0 to 5 volts. Each of the unit cells 11 to 15 is a rechargeable battery such as a lithium ion rechargeable battery or lithium ion battery (sometimes Li-ion battery or LIB), a nickel-metal hydride battery (NiMH or Ni-MH) or nickel-metal hydride rechargeable battery, etc.

A line L1 is arranged between adjacent unit cells, for example, between the unit cells 11 and 12. One end of each line L1 is connected to the corresponding unit cell, and the other end of each line L1 is connected to a branch node from which a line L2 and a line L3 are branched (excepting one line L1 connected to the distal negative electrode side of the battery pack 10). Each of the branch lines L2 is connected to a common connection line L20. Further, each of the branch lines L3 is connected to a common connection line L30. The line L20 is connected to the battery monitoring device 20 and the voltage difference detection device 40. Similarly, the line 30 is also connected to the battery monitoring device 20 and the voltage difference detection device 40. The battery monitoring device 20 and the voltage difference detection device 40 will be explained later in detail.

A switching section 21 is arranged between a first line group and a second line group. The first line group consist of the line L1 at the distal negative electrode side, the branch line L2 and the branch line L3. The second line group consists of the connection lines L20 and L30. The switching section 21 consists of switches SW1 and SW2.

In more detail, as shown in FIG. 1, the switches SW1 are arranged on the line L1 at the distal negative electrode side and the branch lines L3, respectively. The switches SW2 are arranged on the branch lines L2, respectively. The switching operation of the switches SW1 and SW2 provides the connection and disconnection between each of the unit cells 11 to 15 and the battery monitoring device 20, and similarly, the connection and disconnection between each of the unit cells 11 to 15 and the voltage difference detection device 40.

The battery monitoring device 20 detects a voltage of each of the unit cells 11 to 15. The battery monitoring device 20 is equipped with, i.e. consists of an input-side switching section 22, a capacitor C1, an output-side switching section 24 and an analogue to digital converter (ADC) 26.

The input-side switching section 22 is equipped with a switch SW and a switch SWB. The switch SWA is arranged between the connection line L20 and a connection terminal A. The switch SWB is arranged between the connection line L30 and a connection terminal B.

The capacitor C1 is connected selectively to one of the unit cells 11 to 15 through the switching section 21 and the input-side switching section 22 (first open and close section). The capacitor C1 is charged by the electric power of the selected unit cell, i.e. charged by the selected unit cell in short. One terminal of the capacitor C1 is connected to the switch SWA, and the other terminal of the capacitor C1 is connected to the switch SWB.

The output-side switching section 24 is equipped with a switch SWC and a switch SWD. The switch SWC is arranged on the connection line L20 between the connection terminal A and the ADC 26. The switch SWD is arranged on the connection line L30 between the connection terminal B and the ADC 26.

The ADC 26 converts a charged voltage of the capacitor C1 in analogue form to digital signals which can be processed by the microcomputer 50. In more detail, the ADC 26 has an input voltage range which is equal to the input voltage range (within a range of 0 to 5 volts in each unit cell) of the capacitor C1. This input voltage range of the ADC 26 is an allowable voltage range of the AD conversion. The ADC 26 performs the AD conversion of a voltage within the input voltage range by a predetermined resolution (for example, 12 bits).

The microcomputer 50 (control section) is equipped with a central processing unit (CPU), a read only memory (ROM), a random access memory (RAM), rewritable flash memory, etc. The microcomputer 50 reads programs stored in the ROM, etc. and executed the programs to perform a voltage detection process, an equalization process, etc. The equalization process equalizes a dispersion of voltage between the unit cells 11 to 15. The microcomputer 50 outputs the results obtained by the execution of the programs to an upper-side control device (not shown).

In the structure previously described, when the switches SW1 (or the switches SW2) at both sides of one unit cell are turned on, i.e. enters a connection state, and the switching section 22 is turned on, i.e. enters a connection state, the capacitor C1 is charged by the electric power of this unit cell.

When all of the switches including the input-side switching section 22 have been turned off, and the output-side switching section 24 is turned on, i.e. enters the connection state during the charged state of the capacitor C1, the analogue voltage of the capacitor C1 is supplied to the ADC 26. When receiving the analogue voltage of the capacitor C1, the ADC 26 converts the received analogue voltage to a digital voltage as a voltage detection value. The microcomputer 50 receives the voltage detection value in digital form transmitted from the ADC 26, and detects the voltage of the unit cell. The microcomputer 50 calculates a difference between the detection values of the unit cells to obtain a dispersion of voltage between the unit cells 11 to 15.

By the way, a voltage conversion error occurs during the AD conversion performed by the ADC 26. The voltage conversion error increases in accordance with increasing of the input voltage range of the ADC 26. For example, when having a resolution of 12 bits and the input voltage range of 0 to 5 volts, a least significant bit (LSB) as the minimum value of the voltage resolution of the ADC 26 becomes 1.22 mV. When the voltage conversion accuracy of the ADC 26 is 10 LSB, the voltage conversion error becomes 12.2 mV. Accordingly, when the microcomputer 50 calculates a voltage difference between the unit cells, the voltage conversion error contained in the voltage detection value of each of the unit cells is accumulated. This case contains a possible problem for the calculated value of the voltage difference to contain a maximum 24.4 mV error.

In order to suppress the voltage conversion error caused by the AD conversion, it is possible to use an ADC having a large bit number. However, such a countermeasure needs a complicated and large sized circuit. The complicated and large sized circuit consumes a large amount of electric power.

The exemplary embodiment provides the voltage monitoring system with increased detection accuracy of a voltage difference between the unit cells without increasing the bit number of the ADC 26. This makes it possible to increase the processing accuracy such as an accuracy of the equalization process using the voltage difference.

In more detail, it is possible for the voltage difference detection device 40 in the voltage monitoring system according to the exemplary embodiment to improve and increase the detection accuracy of a voltage difference between the unit cells 11 to 15. As shown in FIG. 1, the voltage difference detection device 40 is equipped with an input-side switching section 41, a capacitor C2, a capacitor connection section 43, an output-side switching section 44, a voltage level-shift circuit 45 and an analogue to digital converter (ADC) 46.

As shown in FIG. 1, the input-side switching section 41 is equipped with a switch SWE connected to the connection line L20 and a switch SWF connected to the connection line L30.

The capacitor C2 is connected selectively to one of the unit cells 11 to 15 through the switching section 21 and the input-side switching section 41 (as second open and close section). The capacitor C2 is charged by the electric power of the selected unit cell. One terminal of the capacitor C2 is connected to the switch SWE and the other terminal thereof is connected to the switch SWF.

The capacitor connection section 43 is equipped with a switch SWG. The capacitor C1 and the capacitor C2 are connected in the reverse-polarity series connection by turning on the switch SWG in the first switching section 43. These capacitors C1 and C2 are charged by different unit cells, respectively. A voltage generated in the capacitors C1 and C2 connected in series by the switch SWG is supplied to the ADC 46 through the output-side switching section 44 and the voltage level-shift circuit 45.

Figure 2:
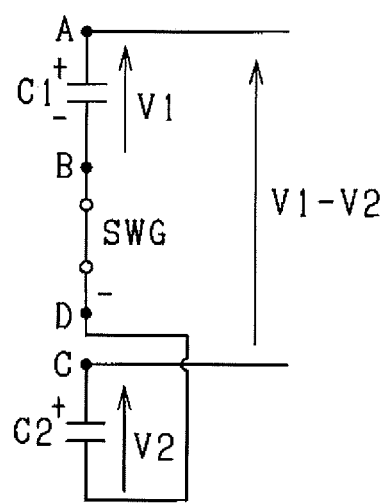
FIG. 2 is a view explaining a connection state (reverse-polarity series connection) of a first capacitor and a second capacitor in the battery monitoring system according to the exemplary embodiment of the present invention.

FIG. 2 is a view explaining a connection state, i.e. a reverse-polarity series connection of the first capacitor C1 and the second capacitor C2 in the battery monitoring system according to the exemplary embodiment.

For example, as shown in FIG. 2, the switch SWG is turned on (i.e. enters the connection state) after the capacitors C1 and C2 have been charged so that the connection terminal B of the capacitor C1 becomes a negative electrode, the connection terminal A of the capacitor C1 becomes a positive electrode, the connection terminal C of the capacitor C2 becomes a positive electrode, and the connection terminal D of the capacitor C2 becomes a negative electrode. In the reverse-polarity series connection, the negative electrodes of the capacitors C1 are connected to the negative electrode of the capacitor C2 together, i.e. the connection terminals B and D are connected together, so that the capacitors C1 and C2 are connected in the reverse-polarity series connection to generate a voltage difference between the capacitors C1 and C2.

The output-side switching section 44 is equipped with a switch SWH and a switch SWK. The switch SWH is arranged between the connection terminal A of the capacitor C1 and the voltage level-shift section 45. In more detail, one terminal of the switch SWH is connected to a connection node on the connection line L20 between the connection terminal A of the capacitor C1 and the output-side switching section 24. The other terminal of the switch SWH is connected to the voltage level-shift section 45. On the other hand, the switch SWK is arranged between the voltage level-shift section 45 and the connection terminal C of the capacitor C2.

The ADC 46 performs the AD conversion of a voltage difference between the capacitors C1 and C2. The exemplary embodiments provide the ADC 46 having an input voltage range which corresponds to a possible voltage difference between the capacitors C1 and C2. For example, the ADC 46 having an input voltage range of 0 to 0.1 volts. When the ADC 26 has a voltage resolution of 12 bits, the Least significant bit (1 LSB becomes 0.1/4095=0.024 mV. When the ADC 26 has the AD conversion accuracy of 10 LSB, it is possible to suppress the conversion error to be at most 0.24 mV.

Furthermore, because the battery monitoring system according to the exemplary embodiment does not perform any calculation of a voltage difference between the unit cells in the battery pack after the completion of the AD conversion, it is possible to suppress the conversion error of the voltage difference at most 0.24 mV.

The microcomputer 50 receives digital signals regarding the voltage difference between the unit cells (i.e. between the capacitors C1 and C2) after the AD conversion performed by the ADC 46.

The voltage level-shift circuit 45 is equipped with an operational amplifier (not shown), etc. The voltage level-shift circuit 45 performs a voltage level-shift operation of a voltage at both end terminals of the capacitors C1 and C2. That is, when the capacitors C1 and C2 are connected in the reverse-polarity series connection through the switch SWG in the first switching section 43, and a voltage difference between the capacitors C1 and C2 has one of a positive value or a negative value due to a magnitude relation between these capacitors C1 and C2. The voltage level-shift circuit 45 boosts a voltage potential of the voltage difference between the capacitors C1 and C2 before the voltage difference between the capacitors C1 and C2 is supplied to the ADC 46. This makes it possible for the ADC 46 to receive a positive value of the voltage difference between the capacitors C1 and C2. For example, when a possible voltage difference between the capacitors C1 and C2 is within a range of −50 mV to +50 mV, the voltage level-shift circuit 45 performs the voltage level-shift operation of a voltage difference between the capacitors C1 and C2 by 50 mV. This makes it possible for the ADC 26 to receive the voltage difference between the capacitors C1 and C2 within an input voltage range of 0 to 100 mV.

Next, a description will now be given of the operation of the battery monitoring system according to the exemplary embodiment with reference to FIG. 3A and FIG. 3B.

Figure 3A:
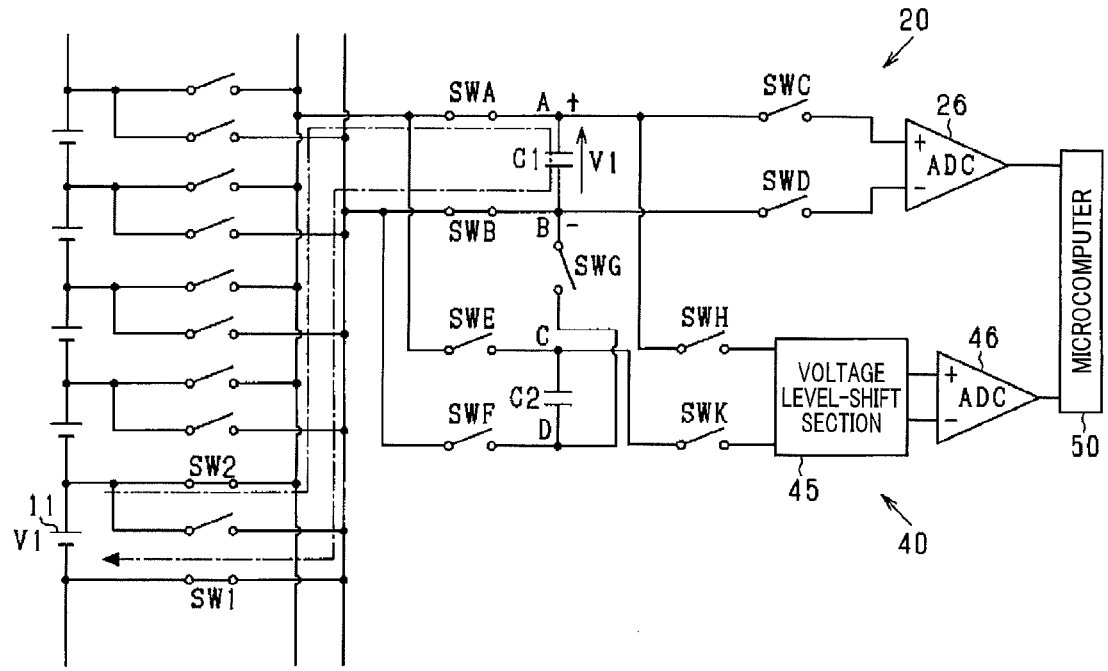
FIG. 3A and FIG. 3B are views showing operation states of the battery monitoring system according to the exemplary embodiment of the present invention.
Figure 3B:
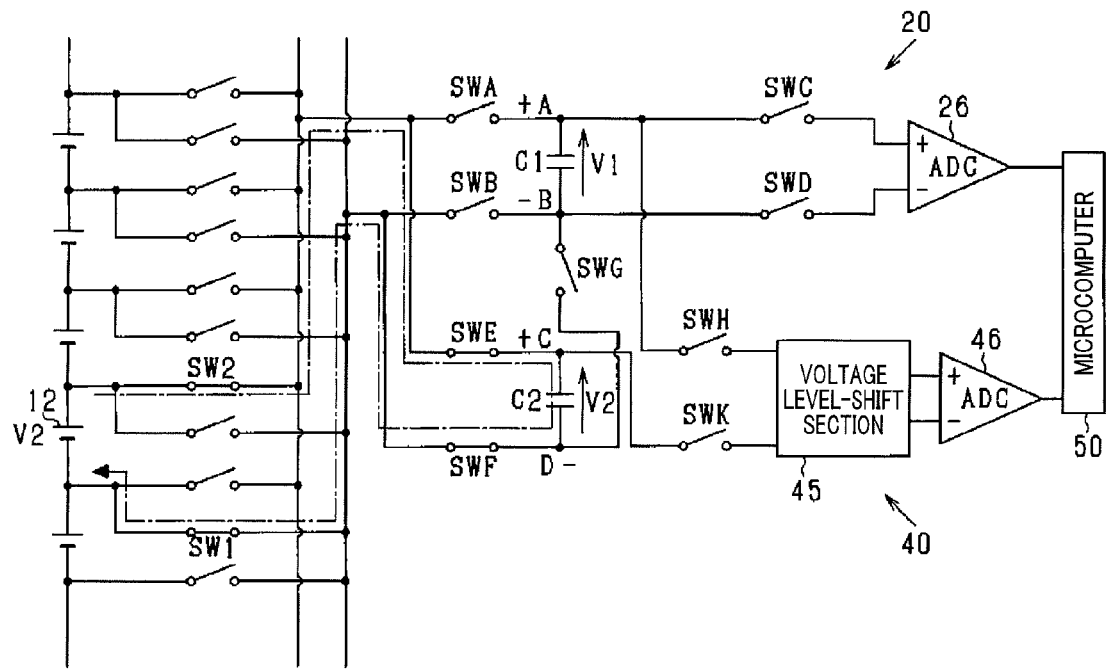

FIG. 3A and FIG. 3B are views showing the operation states of the battery monitoring system according to the exemplary embodiment. The microcomputer 50 executes the operations shown in FIG. 3A and FIG. 3B.

As shown in FIG. 3A, the switch SW1 connected to the negative electrode side of the unit cell 11 and the switch SW2 connected to a positive electrode side of the unit cell 12 are turned on, and the switches SWA and SWB are turned on (i.e. enter the connection state), the capacitor C1 is charged by the voltage V1 of the unit cell 11.

When the switches SWC and SWD are turned on (i.e. enters the connection state) after the completion of the charging of the capacitor C1, and all of the switches are turned off once, the capacitor C1 is connected to the ADC 26. The ADC 26 performs the voltage conversion of the voltage of the capacitor C1, and outputs the obtained digital value of the voltage of the capacitor C1 to the microcomputer 50. The microcomputer 50 receives and detects the voltage V1 in digital form of the unit cell 11.

As shown in FIG. 3B, after the state shown in FIG. 3A, the switch SW1 connected to the positive electrode side of the unit cell 12, and the switch SW2 connected to the negative electrode side of the unit cell 12 are turned on (i.e. enters the connection state), the capacitor C2 is charged by the voltage V2 of the unit cell 12.

When the switch SWG is turned on after the completion of the charging of the capacitor C2, and all of the switches are turned off (i.e. enters the disconnection state) once, a voltage difference between the capacitors C1 and C2 is generated because the capacitors C1 and C2 are connected in the reverse-polarity series connection to generate the voltage difference between the capacitors C1 and C2. After this, when the switches SWH and SWK are turned on (i.e. enters the connection state), the voltage level-shift circuit 45 boosts the voltage difference between the capacitors C1 and C2.

The ADC 46 performs the AD conversion of the voltage difference between the capacitors C1 and C2 connected in the reverse-polarity series connection. In this case, the ADC 46 has the input voltage range which corresponds to the possible voltage range (0 to 0.1 V) of a voltage difference between the capacitors C1 and C2. For this reason, this makes it possible to have a narrow input voltage range and reduce a conversion error caused by the AD conversion as compared with a case in which the input-voltage range of the ADC 46 is determined in accordance with the possible voltage range of the unit cells 11 to 15. As a result, it is possible for the battery monitoring system according to the exemplary embodiment to increase the detection accuracy of a voltage difference between the unit cells.

The battery monitoring system according to the exemplary embodiment repeatedly executes the processes previously described to calculate a voltage difference between each pair of the unit cells 11 to 15 adjacently to each other. For example, the capacitor C2 is charged with the unit cell which is sequentially selected from the unit cells 12 to 15 while maintaining the charged state of the capacitor C1 charged by the unit cell 11. Every time when the capacitor C2 is charged by the selected unit cell, the switch SWG is turned on to calculate a voltage difference between the capacitor C1 charged by the unit cell 11 and the capacitor C2 charged by each of the unit cells 11 to 15. This makes it possible to reduce the number of times the capacitors C1 and C2 are charged, and calculate a voltage difference between the unit cells. As a result, it is possible for the battery monitoring system according to the exemplary embodiment to have the optimizing process.

A description will now be given of excellent effects of the battery monitoring system according to the exemplary embodiment.

A conventional technique performs the AD conversion of converting an analogue detection value of each unit cell to a digital voltage value, and subtracts the digital voltage values of the unit cells to calculate a voltage difference between these unit cells. The AD conversion generates a conversion error due to a resolution of the ADC (analogue to digital converter). This conversion error strongly affects the calculation accuracy of calculating a voltage difference between the unit cells. Furthermore, the more the input-voltage range of the ADC increases, the more the conversion error of the ADC increases.

The battery monitoring system according to the exemplary embodiment is equipped with the capacitors C1 and C2, each of which is connected to each of the unit cells 11 to 15. After the capacitor C1 has been charged by the unit cell and the capacitor C2 has been charged by one selected from the unit cells 12 to 15, the capacitors C1 and C2 are connected in series to form a reverse-polarity series connection. Finally, a voltage at both ends of the capacitors C1 and C2 connected in series is supplied to the ADC 46. In this case, because the ADC 46 receives a voltage difference of the capacitors C1 and C2, i.e. the voltage at both ends of the capacitors C1 and C2 connected in series, it is possible for the ADC 46 to have a narrow input voltage range, as compared with that of the ADC in the conventional technique. Accordingly, the battery monitoring system according to the exemplary embodiment has the reduced conversion error and increased calculation accuracy of calculating a voltage difference between the unit cells in the battery pack.

A detected voltage difference between two unit cells in a battery pack has a positive value or a negative value. When a voltage level before the ADC 46 receives a voltage level of the detected voltage difference between the two unit cells is reduced, it is possible for the battery monitoring system to correctly perform the AD conversion of the detected voltage difference even if the voltage difference is a positive value or a negative value.

The subject matter of the present invention is not limited by the exemplary embodiment previously described. It is possible for the battery monitoring system according to the present invention to have following various modifications.

In the structure of the battery monitoring system according to the exemplary embodiment previously described, the negative electrode side of the capacitor C1 and the negative electrode side of the capacitor C2 are connected together to form the reverse-polarity connection. However, the subject matter of the present invention is not limited by this. It is possible to connect the positive electrode side of the capacitor C1 and the positive electrode side of the capacitor C2 to each other.

It is possible for the ADC 26 for detecting a voltage of each unit cell and the ADC 46 for detecting a voltage difference between two unit cells to have a different bit number, i.e., a different resolution. Specifically, it is possible for the ADC 46 to have its bit number which is smaller than the bit number f the ADC 26. For example, the ADC 46 has a resolution of 10 bits or 8 bits, and the ADC 26 has a resolution of 12 bits. This structure makes it possible for the battery monitoring system to have a simple structure because the ADC 46 detects a voltage difference of unit cells which is within a voltage range smaller than that of the ADC 26 for detecting a voltage of each unit cell.

The battery monitoring system according to the exemplary embodiment previously described calculates a voltage difference between a pair of unit cells in the unit cells 11 to 15 of the battery pack 10 by switching the unit cell for charging the capacitor C2 on the basis of the voltage level of the capacitor C1. However, the concept of the present invention is not limited by this. For example, it is possible to charge the capacitors C1 and C2 by using any two unit cells in the unit cells 11 to 15, and calculate a voltage difference between the two unit cells on the basis of the voltages of the capacitors C1 and C2.

The exemplary embodiment previously described has shown an example for sequentially detecting a voltage of each of the unit cells by using on capacitor C1. However, the concept of the present invention is not limited by this. For example, it is possible to apply the concept of the present invention to a battery monitoring system of a double flying capacitor type capable of detecting voltages of two or more unit cells simultaneously by using double flying capacitors connected in series composed of two capacitors. In this case, it is sufficient to have a structure in which the capacitor C2 (used in the exemplary embodiment) is connected to both end terminals of the double flying capacitors.

The battery monitoring system according to the exemplary embodiment previously described has the structure in which the capacitor C1 and the capacitor C2 are connected in the reverse-polarity series connection through the switch SWG in the first switching section 43. However, the concept of the present invention is not limited by this. For example, it is possible to eliminate the switch SWG to have a simple structure so that capacitor C1 and the capacitor C2 are directly connected parallel to each other in the reverse-polarity series connection without using the switch SWG.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A battery monitoring system of a flying capacitor type capable of detecting a voltage difference of unit cells connected in series in a battery pack, and a detection result as the voltage difference being transmitted to an analog-to-digital converter, the battery monitoring system comprising:
   a first capacitor and a second capacitor connectable to different unit cells in the battery pack, respectively;
   a first switching section, by which the first capacitor and the second capacitor are connected in a reverse-polarity series connection after the first capacitor and second capacitor are charged by corresponding different unit cells, respectively; and
   a second switching section supplying to the analog-to-digital converter a voltage from both ends of the first capacitor connected in the reverse-polarity series connection and both ends of the second capacitor connected in the reverse-polarity series connection.

2. The battery monitoring system according to claim 1, further comprising:
   a first open and close section through which each of the unit cells is configured to be selectively connected to the first capacitor; and
   and a second open and close section through which each of the unit cells is configured to be selectively connected to the second capacitor, the second capacitor being selectively connected to a unit cell different from a unit cell selectively connected to the first capacitor,
   wherein the first open and close section and the second open and close section disconnect the connection between the unit cells and the first and second capacitors after the first capacitor and the second capacitor have been charged by the selected unit cells through the first open and close section and the second open and close section, and
   the first switching section is turned on to connect the first capacitor and the second capacitor in the reverse-polarity series connection.

3. The battery monitoring system according to claim 1, further comprising:
   a voltage level-shift section capable of reducing the voltage difference between the first capacitor and the second capacitor connected in the reverse-polarity series connection.

4. The battery monitoring system according to claim 2, further comprising:
   a voltage level-shift section capable of reducing the voltage difference between the first capacitor and the second capacitor connected in the reverse-polarity series connection.

5. The battery monitoring system according to claim 1, further comprising:
   a control section for repeatedly performing charging of the second capacitor after the first capacitor has been charged by one of the unit cells,
   wherein the control section turns on the first switching section in order to connect the first capacitor and the second capacitor in the reverse-polarity series connection, and instructs the second switching section to supply the voltage difference between the first capacitor and the second capacitor to the analog-to-digital converter.

6. The battery monitoring system according to claim 2, further comprising:
   a control section for repeatedly performing charging of the second capacitor after the first capacitor is charged by one of the unit cells,
   wherein the control section turns on the first switching section in order to connect the first capacitor and the second capacitor in the reverse-polarity series connection, and instructs the second switching section to supply the voltage difference between the first capacitor and the second capacitor to the analog-to-digital converter.

7. The battery monitoring system according to claim 3, further comprising:
   a control section for repeatedly performing charging of the second capacitor after the first capacitor is charged by one of the unit cells,
   wherein the control section turns on the first switching section in order to connect the first capacitor and the second capacitor in the reverse-polarity series connection, and instructs the second switching section to supply the voltage difference between the first capacitor and the second capacitor to the analog-to-digital converter.

* * * * *